United States Patent [19]
Park

[11] Patent Number: 5,990,502
[45] Date of Patent: *Nov. 23, 1999

[54] HIGH DENSITY GATE ARRAY CELL ARCHITECTURE WITH METALLIZATION ROUTING TRACKS HAVING A VARIABLE PITCH

[75] Inventor: Jonathan C. Park, Gaithersburg, Md.

[73] Assignee: LSI Logic Corporation, Milpitas, Calif.

[*] Notice: This patent is subject to a terminal disclaimer.

[21] Appl. No.: 08/580,908

[22] Filed: Dec. 29, 1995

[51] Int. Cl.⁶ .................................................. H01L 27/10
[52] U.S. Cl. .......................... 257/202; 257/207; 257/211
[58] Field of Search ..................... 257/202–211

[56] References Cited

U.S. PATENT DOCUMENTS

| | | |
|---|---|---|
| 4,701,860 | 10/1987 | Mader . |
| 4,727,493 | 2/1988 | Taylor, Sr. . |
| 4,742,019 | 5/1988 | Bechade ................................ 257/211 |
| 4,745,084 | 5/1988 | Rowson et al. ......................... 437/51 |
| 4,786,904 | 11/1988 | Graham, III et al. . |
| 4,864,381 | 9/1989 | Seefeldt et al. . |
| 4,928,160 | 5/1990 | Crafts . |
| 4,975,758 | 12/1990 | Crafts . |
| 4,978,633 | 12/1990 | Seefeldt et al. . |
| 5,055,716 | 10/1991 | El Gamel . |
| 5,068,548 | 11/1991 | El Gamel . |
| 5,087,839 | 2/1992 | Whittaker et al. . |
| 5,214,299 | 5/1993 | Gal et al. ................................. 257/208 |
| 5,260,881 | 11/1993 | Agrawal et al. . |
| 5,289,021 | 2/1994 | El Gamal . |
| 5,298,774 | 3/1994 | Ueda et al. ............................. 257/206 |
| 5,309,091 | 5/1994 | El-Ayat et al. . |
| 5,329,460 | 7/1994 | Agrawal et al. . |
| 5,341,041 | 8/1994 | El Gamal . |
| 5,384,472 | 1/1995 | Yin . |
| 5,399,517 | 3/1995 | Ashtaputre et al. .................... 257/211 |
| 5,404,034 | 4/1995 | Yin . |
| 5,420,447 | 5/1995 | Waggoner .............................. 257/206 |
| 5,444,276 | 8/1995 | Yokota et al. ......................... 257/207 |
| 5,452,245 | 9/1995 | Hickman et al. ...................... 365/154 |
| 5,473,195 | 12/1995 | Koike .................................... 257/210 |
| 5,493,135 | 2/1996 | Yin . |
| 5,581,202 | 12/1996 | Yano et al. ............................ 257/206 |
| 5,612,553 | 3/1997 | Arakawa ............................... 257/206 |
| 5,631,478 | 5/1997 | Okumura .............................. 257/211 |

FOREIGN PATENT DOCUMENTS

0782188 A2  7/1997  European Pat. Off. .

*Primary Examiner*—David B. Hardy

[57] ABSTRACT

A gate array cell architecture is provided with routing tracks at variable track pitches, thereby increasing the density of the architecture. Orientation of the devices in the gate cells perpendicularly to the routing tracks in the second metallization layer provides an increased porosity in this layer. The orientation allows an N channel device to be made smaller than a P channel device within a gate cell, to provide balanced devices. The perpendicular orientation also provides more contact points for source or drain. When the mulitple contacts are used to connect the device to a power source, the multiple contacts reduce the effective resistance and increase the reliability of the devices.

20 Claims, 5 Drawing Sheets

HIGH DENSITY GATE ARRAY CELL ARCHITECTURE WITH METALLIZATION ROUTING TRACKS HAVING A VARIABLE PITCH

FIELD OF THE INVENTION

The present invention relates to the field of gate array cell architecture, and more particularly, to a gate array cell architecture having a high density and a method of making the same.

BACKGROUND OF THE INVENTION

Gate arrays are used extensively to fabricate integrated circuits which perform customer specialized functions. The semiconductor devices of the gate arrays are designed into base patterns and fabricated into wafers for customer specific functional interconnection during metallization. Consequently, the integrated circuit semiconductor devices can be interconnected to perform the logic functions desired by a customer in the relatively short time needed to form the metallization patterns.

The metallization process by which the pre-existing transistors and other active devices in the base set are interconnected to form functional configurations typically uses one or more metallization layers, a pattern of contacts that connect from the metallization layers to the semiconductor regions, and vias to interconnect the successive metallization patterns.

Higher density and more reliable devices, with lower levels of power consumption, are desirable. However, integrated circuit design rules impose a number of constraints on the interconnection of the transistors, hampering design efforts towards higher density. For example, a gate array design must satisfy minimum polysilicon width dimensions, minimum spacing between polysilicon conductors, minimum metal width dimensions, minimum spacing between metal conductors, minimum dimensions for contacts, minimum dimensions for vias, and constraints as to vertical placement on the various consecutive layers. Gate array cell architecture designers set a track pitch of routing tracks, connecting gate cells in an array, at a constant value that satisfies the largest of all of the minimum spacings. These limitations may be understood with respect to FIGS. 1 and 2.

FIG. 1 is a schematic depiction of a cell of a prior art gate array, for purposes of explaining some limitations of the prior art gate arrays. This cell, which is replicated numerous times in a tile pattern on a chip, has a number of polysilicon layer patterns 10 for transistor gate electrodes. A P channel diffusion area 12 forms the P channel device and an N channel diffusion area 14 forms the N channel device. A P channel well tap is provided at area 16, and an N channel well tap is provided at area 18.

The lower half of the gate cell in FIG. 1 has its components interconnected to form a device within the gate cell, such as a NAND gate, AND gate, NOR gate and OR gate. The interconnecting of the components of the gate cell to form the device is performed in metallization layers. The first metallization layer forms the primary interconnections of the components of the gate cell that form the devices. For reasons described below, it is often necessary, however, to use a second metallization layer to complete the interconnection of the devices within the gate cell.

In FIG. 1, the components in the lower half of the gate cell are connected together by the first metal in the first metallization layer to form a NAND gate with input ports A and B and an output port Z. These interconnections are depicted as dotted regions in FIG. 1. The VSS and VDD power buses (20, 22) for the devices extend vertically across the gate cells, as indicated in FIG. 1. These buses 20, 22 limit the amount of interconnection that is possible within the gate cells to the area located horizontally between the two buses 20, 22, at least within the first metallization layer. Due to the limited amount of interconnectivity caused by the location of the buses in the first metallization layer, the second metallization layer is typically required to form interconnections within the gate cell to form the devices. The use of second metal in the second metallization layer to form the devices creates a "porosity" problem in the conventional architecture.

In FIG. 2, cells 24 are arranged in cell placement columns 26, separated by routing columns 28. The horizontal routing tracks through a cell 24 are provided in the second metallization layer direction, and are also seen in FIG. 1 with reference numeral 30. These routing tracks (hereinafter referred to as m2 routing tracks) 30 are used to provide horizontal connections between gate cells 24. The vertical routing tracks 32, (also shown in FIG. 1 and hereinafter referred to as m1 routing tracks) extend in a vertical direction through the gate cells 24 and in the routing channels 28. These m1 tracks 32 are found in the first metallization layer.

The problem caused by using the second metallization layer to form the devices within the gate cell becomes apparent with reference made to FIGS. 1 and 2. In FIG. 1, there are only three m2 tracks 30 that pass through the device. When the second metal is used to interconnect the components of the gate cell to form a device, the m2 routing tracks 30 running horizontally will be effectively not useable for connecting the device in the gate cell to the device in another gate cell. In other words, the m2 routing track 30 will be blocked. With only three possible m2 routing tracks 30 running through the device, and given the limited amount of interconnectivity available between the power buses 20, 22, it is likely that the three m2 routing tracks 30 will be blocked by the second metal required to complete formation of the device. Since there are very few or no "route throughs" in such cells, these cells are considered to have a "low porosity".

The low porosity of the cells causes many detours to be taken when routing devices together, as depicted in the example of FIG. 2. In this case, connecting the device of gate cell 24A to the device of gate cell 24B requires a tortuous path to a gate cell which does not have a device formed in the cell so that the route through may be taken. Connection is then made to the first metallization layer in the routing column 28 and then horizontally in the second metallization layer to the second device in the gate cell 24B.

There are a number of disadvantages that arise from the above-described architecture, including the unbalanced rise and fall time of the P and N channel devices which are of the same size. Changing the relative sizes of the P diffusion area and the N diffusion area is difficult due to the limitations created by the cell routing. Also, higher densities are difficult to achieve due to the practice of providing unvarying track pitches between the routing tracks, both in the vertical and in horizontal directions, in order to meet the minimum design standards. Also, due to the low porosity, power buses typically only have one contact with the individual devices, so that there is a relatively high effective resistance and relatively unreliable contact since it is only being made at one point.

SUMMARY OF THE INVENTION

There is a need for a gate array cell architecture which has a higher density, allows transistors to be balanced, and also permits multiple contacts for source or drain to thereby provide increased reliability.

These and other needs are met by certain embodiments of the present invention which provide a gate array cell architecture having an array of gate cells, these gate cells having internal components. A first metallization layer interconnects the internal components within the gate cells to form devices. A set of first metallization routing tracks in the first metallization layer extend parallel to one another and in a vertical direction across the array of gate cells. A second metallization layer having a set of second metallization routing tracks extend parallel to one another and horizontally across the array of gate cells. At least one of the set of first metallization routing tracks or the set of second metallization routing tracks have a variable pitch within the set.

An advantage made possible by the variance of the track pitches in the first and/or second metallization routing tracks is the higher density that may be achieved. The present invention varies the track pitch to satisfy the individual design laws, but does not set all of the track pitches the same to satisfy the design law requiring a maximum track pitch. Because of this, denser routing may be performed in areas such as the routing columns, which have lower spacing requirements than other areas, such as cell placement columns. In making the gate array cell architecture denser, smaller chip sizes are possible, with better performance as the amount of global routing is lessened. This leads to decreased power consumption since there is less metal used to perform the routing. Also, with smaller chips, a smaller die may be used, with a resultant increased chip yield.

Another aspect of the present invention, a method of manufacturing a gate array cell structure, is provided in which a plurality of gate cells are formed in an array, and devices are formed within selected gate cells with first metal in a first metallization layer. Selected ones of the devices are interconnected with first metal that is routed along routing tracks extending in a vertical direction over the array. The track pitch of the routing tracks in the first metallization layer is varied. Selected ones of the devices are interconnected with a second metal in a second metallization layer, this second metal being routed along tracks extending in a horizonal direction over the array. The track pitch of the routing tracks in the second metallization layer is also varied.

Another aspect of the present invention which satisfies the earlier stated needs is a gate cell array architecture comprising a plurality of gate cells, at least some of which have both an N channel device and a P channel device, where the P channel device is larger than the N channel device. In certain embodiments, the P channel device and the N channel device have respective sizes such that a pull-up time in operation of the P channel device is approximately equal to a pull-down time in operation of the N channel device.

The balancing of the N and P channel devices in a gate array cell architecture provides an improved performance since the pull-down and pull-up times are made more nearly equal.

In a still further aspect of the present invention, which satisfies the earlier stated needs, a gate array cell architecture is provided that comprises an array of gate cells, these gate cells having internal components. A first metallization layer interconnects the internal components within gate cells to form devices within the gate cells. A set of first metallization routing tracks in the first metallization layer extend parallel to one another and in a vertical direction across the array of gate cells. A second metallization layer has a set of second metallization routing tracks that extend parallel to one another and horizontally across the array of gate cells. The gate cells are oriented perpendicularly to the set of second metallization routing tracks. A power bus extends in the first metallization layer in the vertical direction. A power connection is provided in the second metallization layer, and is coupled to the power bus and to certain ones of the devices within the gate cells to provide power to the devices. At least some of the individual devices are coupled to the power connection by multiple contacts with the power connection.

By orienting the gate cells perpendicularly to the set of second metallization routing tracks, as provided in embodiments of the present invention, the porosity of the gate cells in the second metallization layer is relatively high. This allows the second metallization layer to be utilized to provide a power connection, and also provides multiple contacts to power for the devices. These multiple contacts decrease the effective resistance (thereby reducing power consumption of the chip) and increases the reliability of the power connections to the devices.

The orientation of the gate cells perpendicularly to the set of second metallization routing tracks provides mulitple port locations to alleviate congestion.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 1:
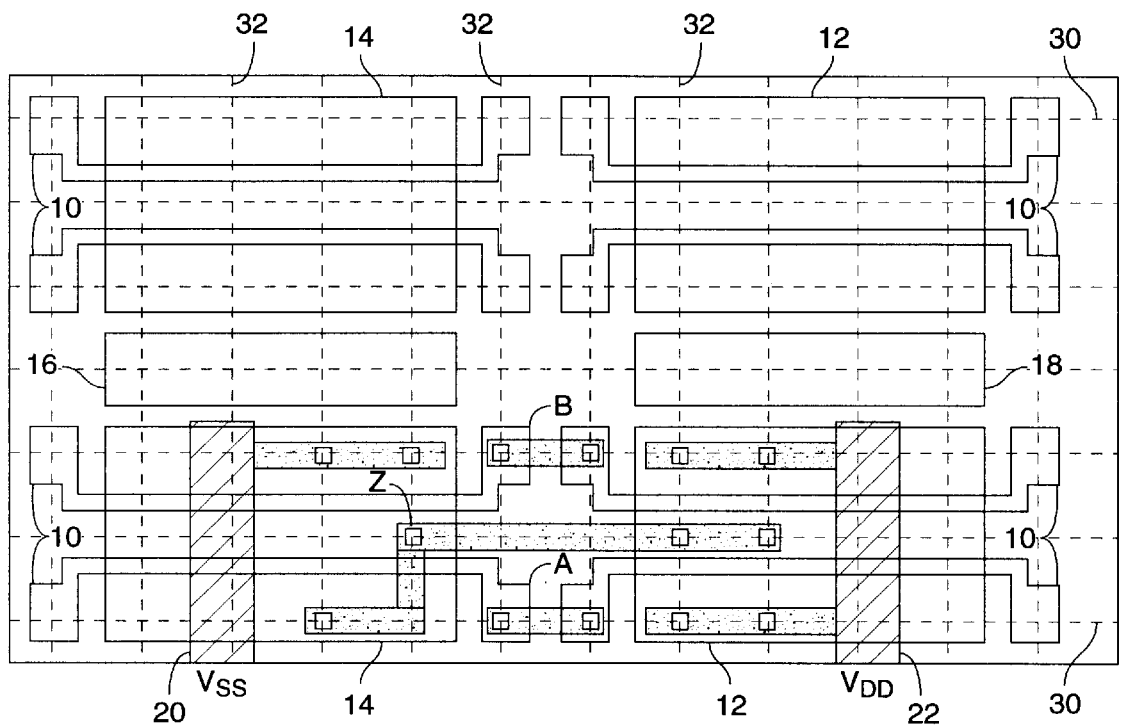
FIG. 1 is a schematic depiction of a gate cell constructed in accordance with the prior art.
Figure 2:
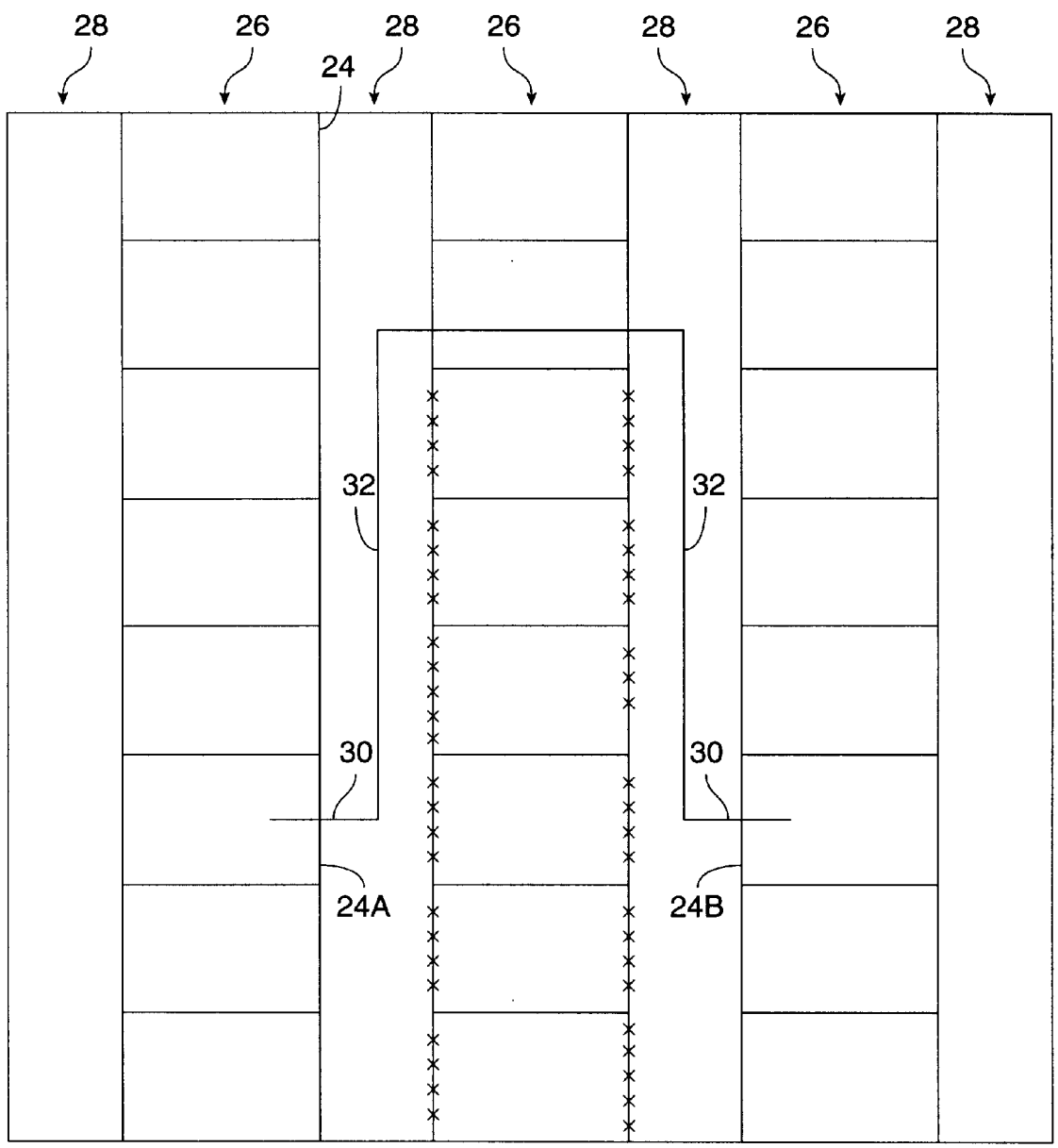
FIG. 2 is a schematic depiction of a gate array cell architecture of the prior art.
Figure 3:
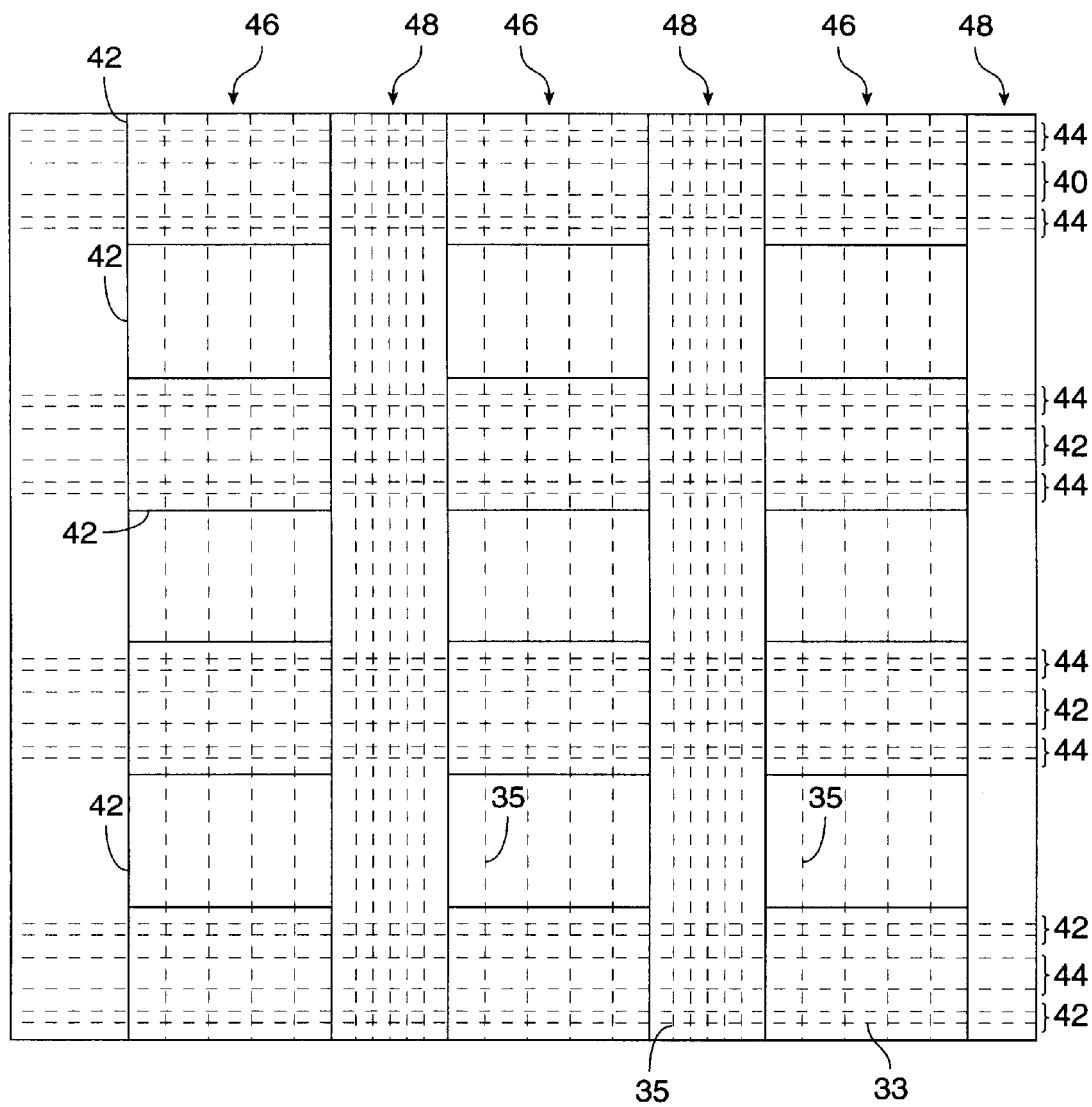
FIG. 3 is a schematic depiction of a gate array cell architecture having a variable track pitch in accordance with an embodiment of the present invention.

FIG. 3 is a schematic depiction of a gate array cell architecture in accordance with an embodiment of the present invention. In this embodiment, the m1 routing tracks and the m2 routing tracks 33 are laid out with variable track pitches, to take advantage of the different design laws for different areas of the gate array cell. (For clarity of illustration and understanding, only every other row of gate cells is depicted with the m2 routing tracks. However, each row of gate cells will have m2 routing tracks in preferred embodiments.) For example, a 3.2 micron limit for the m2 routing tracks 33 is provided in certain areas and is required due to poly to spacing and poly to diffusion spacing. In these areas 40 of gate cell 42, the track pitch for m2 is 3.2 microns. However, the design law for the diffusion area would allow the track pitch for m2 to be 2.8 microns. Hence, the m2 track pitch in the present invention in the diffusion area is set at 2.8 microns. The diffusion area is indicated by reference numeral 44. The varying of the m2 track pitch within the cell makes the cell area smaller for the same number of tracks.

The depiction of FIG. 3 is schematic only, to show variation in the track pitch. The precise variation of the pitch and location of the diffusion areas and other areas of the gate cells is dependent on the specific gate cells themselves, and are thus not shown in more detail.

The m1 routing tracks 35, which run vertically, are also variable in certain embodiments. In the cell placement column 46, the m1 routing tracks 35 may be set to 3.2 microns without violating design laws, and set to 2.7 microns in the channel routing columns 48, without violating design laws in that region. By setting the track pitch to 2.7 microns in the channel routing columns 48, additional m1 routing tracks 35 are available in the routing column 48. This increases the available connection paths for the gate array cell architecture.

Although FIG. 3 depicts both the m2 routing tracks 33 and the m1 routing tracks 35 as having a variable track pitch, other embodiments of the present invention vary only one of the m1 or m2 routing track pitches. Furthermore, the specific track pitches given above are exemplary only, as other specific track pitches are possible and may be required due to different design laws according to the different manufacturing processes available to one of ordinary skill in the art.

Figure 4:
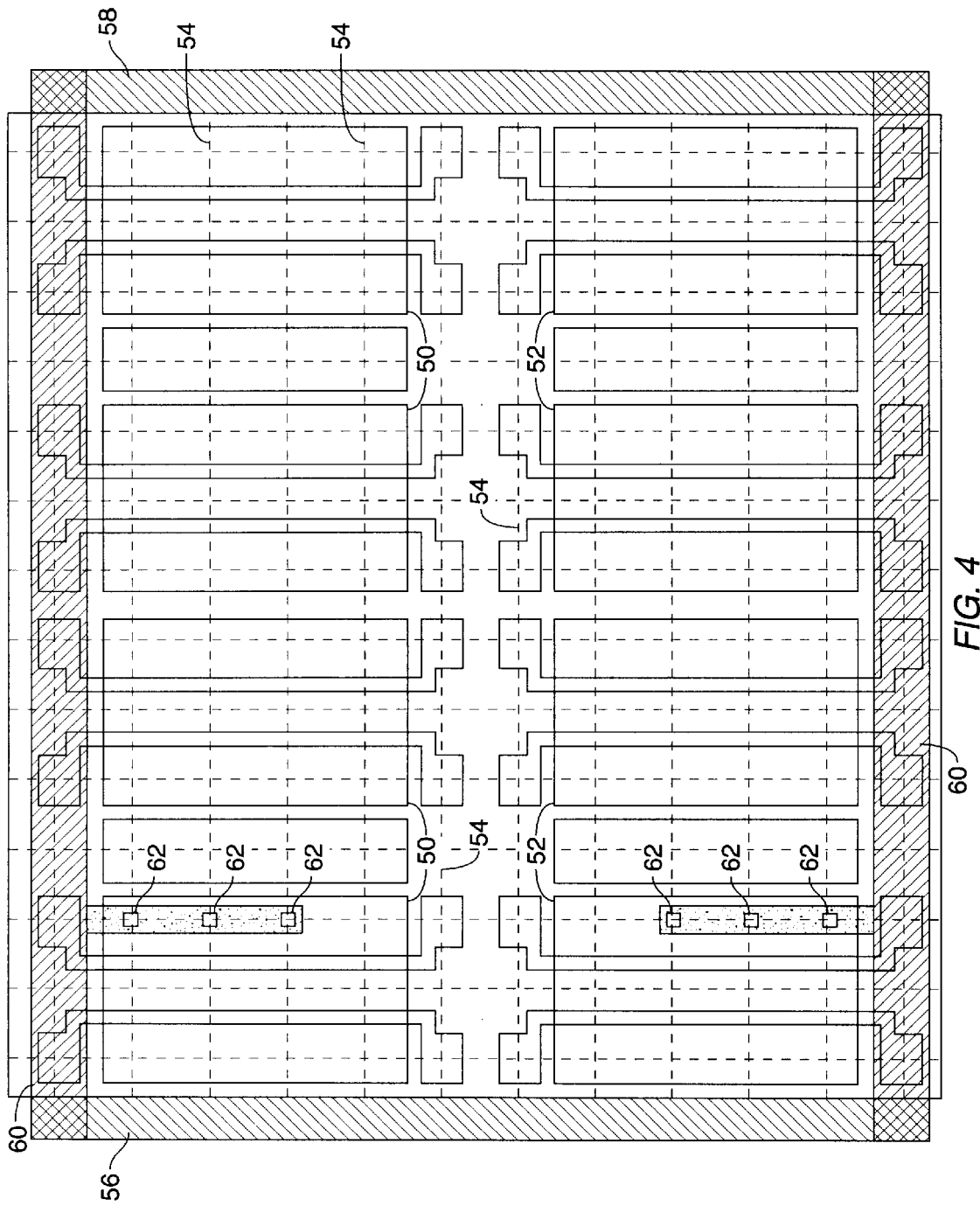
FIG. 4 is a schematic depiction of a cell layout in accordance with an embodiment of the present invention in which multiple contacts are provided for a power connection within the cell.

In addition to the variable track pitch of the present invention, as described with respect to FIG. 3, certain embodiments of the present invention also provide for improved power connection for the devices within the gate cells. This improved power connection is provided by multiple contact points of the devices within the gate cells to a power source. Multiple contact points are made possible by using a cell layout having an increased porosity (reduced or no second metal blockages) in the second metallization layer. Such a cell layout is provided by orienting the devices perpendicularly to the second metal routing tracks, as depicted in FIG. 4. This perpendicular orientation of the devices to second metal routing tracks has been used in a commercially available gate array cell architecture, the 0.8 micron gate array library manufactured by Advanced Microsystems, Inc. of Pocatello, Id. As apparent in FIG. 4, the P channel device 50 and the N channel device 52 are oriented 90° with respect to the m2 routing tracks 54, shown as having a constant track pitch in this embodiment, although the m2 track may have a variable track pitch in other embodiments, as described earlier. The 90° orientation of the P and N channel devices 50, 52 to the m2 routing tracks 54 provides a number of route through tracks and possible contact points. The mulitple port locations alleviate congestion.

Another feature of the known gate array cell architecture is the providing of the power bus (VSS 56 and VDD 58) further towards the outside of the gate array cell, as illustrated. Power buses 56, 58 are in the first metallization layer. A second metallization layer power connection 60 runs horizontally between the power buses 56, 58. From this power connection 56, the P channel device 50 and the N channel device 52 may be connected by second metal.

The present invention provides for connecting the P and N channel devices 50, 52 to the power connection 60 by multiple contact points 62, as depicted in FIG. 4. These multiple contact points reduce the effective resistance on the diffusion side, and add reliability to the power lines. The present invention therefore takes advantage of the increased porosity of a gate array cell architecture in which the devices are oriented perpendicularly to the second metal routing tracks. Furthermore, the increased porosity provides mulitple contacts for source or drain, thereby alleviating congestion.

Although FIG. 4 depicts three contact points for the power connection of the P channel device 50, this is exemplary only as a different plurality of contact points are contemplated within the spirit and scope of the present invention.

Figure 5:
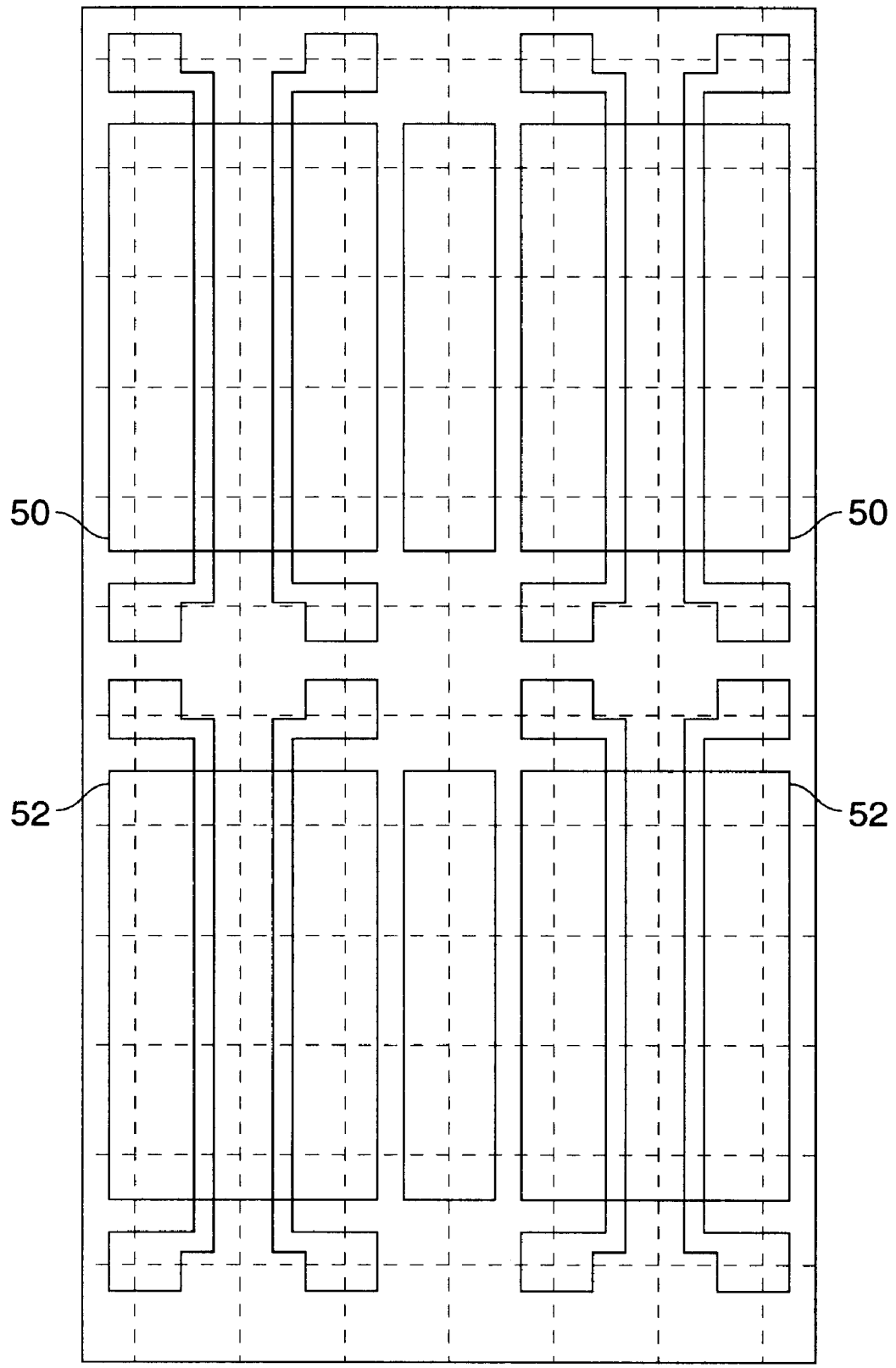
FIG. 5 is a schematic depiction of a cell layout having different sized P and N channel devices in accordance with an embodiment of the present invention.

Another aspect of the present invention is depicted in FIG. 5 in which the P and N channel devices 50, 52 are of different sizes. In the embodiment of FIG. 5, the P channel device is larger in area than the N channel device 52. By varying the channel widths, as illustrated, a balancing of the P and N channel devices 50, 52 may be obtained. The balancing compensates for the fact that the P channel drive strength is usually weaker than N channel drive strength.

In an exemplary embodiment of the present invention, the P channel device width may be 13.4 microns, while the N channel device width is 10.6 microns, although different device widths are contemplated within the spirit and scope of the present invention. By providing different widths of the P and N channel devices 50, 52, the difference between the rise and fall times of the cells is minimized.

The varying of the P and N channel device widths is facilitated by the orientation of the devices perpendicularly to the m2 routing tracks, as depicted in FIG. 5, since there are less problems caused by cell routing when the orientation of the gate cells is as illustrated, rather than in more conventional gate array cell architectures. However, the balancing of the P and N channel devices in a gate array cell architecture has utility in whichever orientation of the devices to the m2 routing tracks are used. The variable track pitch, although not shown in FIG. 5, may also be used in both the m1 metallization layer and the m2 metallization layer in the embodiment of FIG. 5 in order to provide a denser gate array cell architecture and increased routing capability.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A gate array cell architecture comprising:
   an array of gate cells, the gate cells having internal components;
   a first metallization layer that interconnects the internal components within gate cells to form devices within the gate cells;
   a set of first metallization routing tracks in the first metallization layer that extend parallel to one another and only in a vertical direction across the array of gate cells; and
   a second metallization layer having a set of second metallization routing tracks that extend parallel to one another and only horizontally across the array of gate cells;
   wherein at least one of the set of first metallization routing tracks and the set of second metallization routing tracks have a variable pitch within the set.

2. The architecture of claim 1, wherein both the set of first metallization routing tracks and the set of second metallization routing tracks have a variable pitch within the set.

3. The architecture of claim 1, wherein the gate cells are oriented perpendicularly to the set of second metallization routing tracks.

4. A gate array cell architecture comprising:
   an array of gate cells, the gate cells having internal components;

means for interconnecting the internal components within the gate cells to form devices within the gate cells, said means for interconnecting the internal components being located within a first layer and having routing tracks that extend parallel to one another and only in a vertical direction across the array of gate cells; and means for interconnecting gate cells, said means for interconnecting gate cells being located within a second layer and having routing tracks that extend parallel to one another and only horizontally across the array of gate cells; and wherein at least the routing tracks in the first layer and the routing tracks in the second layer have a variable pitch.

5. The architecture of claim 4, wherein the pitch within the routing tracks in the first layer varies from approximately 2.7 to approximately 3.2 microns.

6. The architecture of claim 4, wherein the gate cells are oriented perpendicularly to the routing tracks in the second layer.

7. A method of manufacturing a gate array cell structure, comprising:

forming a plurality of gate cells in an array;

forming devices within selected gate cells with first metal in a first metallization layer;

interconnecting selected ones of the devices with first metal that is routed along routing tracks extending only in a vertical direction over the array, including varying a track pitch of the routing tracks in the first metallization layer; and interconnecting selected ones of the devices with second metal in a second metallization layer, the second metal being routed along tracks extending only in a horizontal direction over the array, including varying a track pitch of the routing tracks in the second metallization layer.

8. The method of claim 7, wherein the gate cells are oriented perpendicularly to the routing tracks in the second layer.

9. A gate array cell architecture comprising:

an array of gate cells, the gate cells having internal components;

a first metallization layer that interconnects the internal components within the gate cells to form devices within the gate cells;

a set of first metallization routing tracks in the first metallization layer that extend parallel to one another and in a vertical direction across the array of gate cells;

a second metallization layer having a set of second metallization routing tracks that extend parallel to one another and horizontally across the array of gate cells, wherein both the set of first metallization routing tracks and the set of second metallization routing tracks have a variable pitch within the set, and wherein the pitch within the set of first metallization routing tracks varies from approximately 2.7 to approximately 3.2 microns.

10. The architecture of claim 9, wherein the array of gate cells include cell placement columns and routing columns, the track pitch of the first metallization routing tracks being approximately 3.2 microns in the cell placement columns and approximately 2.7 microns in the routing columns.

11. The architecture of claim 9, wherein the gate cells have a diffusion area, a polysilicon/polysilicon interface area and a polysilicon/diffusion interface area, the track pitch of the second metallization routing tracks in the diffusion area being approximately 2.8 microns, and approximately 3.2 microns in the polysilicon/polysilicon interface area and in the polysilicon/diffusion interface area.

12. A gate array cell architecture comprising:

an array of gate cells, the gate cells having internal components;

a first metallization layer that interconnects the internal components within the gate cells to form devices within the gate cells;

a set of first metallization routing tracks in the first metallization layer that extend parallel to one another and in a vertical direction across the array of gate cells; and a second metallization layer having a set of second metallization routing tracks that extent parallel to one another and horizontally across the array of gate cells, wherein both the set of first metallization routing tracks and the set of second metallization routing tracks have a variable pitch within the set, and wherein the pitch within the set of second metallization routing tracks varies from approximately 2.8 microns to approximately 3.2 microns.

13. A gate array cell architecture comprising:

an array of gate cells, the gate cells having internal components;

means for interconnecting the internal components within the gate cells to form devices within the gate cells, said means for interconnecting the internal components being located within a first layer and having routing tracks that extend parallel to one another and in a vertical direction across the array of gate cells; and means for interconnecting gate cells, said means for interconnecting gate cells being located within a second layer and having routing tracks that extend parallel to one another and horizontally across the array of gate cells, wherein at least the routing tracks in the first layer and the routing tracks in the second layer have a variable pitch, and wherein the pitch within the routing tracks in the first layer varies from approximately 2.7 to approximately 3.2 microns.

14. The architecture of claim 13, wherein the array of gate cells include cell placement columns and routing columns, the track pitch of the routing tracks in the first layer being approximately 3.2 microns in the cell placement columns and approximately 2.7 microns in the routing columns.

15. The architecture of claim 13, wherein the gate cells have a diffusion area, a polysilicon/polysilicon interface area and a polysilicon/diffusion interface area, the track pitch of the routing tracks in the second layer in the diffusion area being approximately 2.8 microns, and approximately 3.2 microns in the polysilicon/polysilicon interface area and in the polysilicon/diffusion interface area.

16. A gate array cell architecture comprising:

an array of gate cells, the gate cells having internal components;

means for interconnecting the internal components within the gate cells to form devices within the gate cells, said means for interconnecting the internal components being located within a first layer and having routing tracks that extend parallel to one another and in a vertical direction across the array of gate cells; and means for interconnecting gate cells, said means for interconnecting gate cells being located within a second layer and having routing tracks that extend parallel to one another and horizontally across the array of gate cells, wherein at least the routing tracks in the first layer and the routing tracks in the second layer have a variable pitch, and wherein the pitch within the routing tracks of the second layer varies from approximately 2.8 microns to approximately 3.2 microns.

17. A method of manufacturing a gate array cell structure, comprising:

forming a plurality of gate cells in an array;

forming devices within selected gate cells with first metal in a first metallization layer;

interconnecting selected ones of the devices with first metal that is routed along routing tracks extending in a vertical direction over the array, including varying a track pitch of the routing tracks in the first metallization layer; and interconnecting selected ones of the device with second metal in a second metallization layer, the second metal being routed along tracks extending in a horizontal direction over the array, including varying a track pitch of the routing tracks in the second metallization layer, wherein the step of varying the track pitch of the routing tracks in the first metallization layer includes varying the track pitch from approximately 2.7 to approximately 3.2 microns.

18. The method of claim 17, wherein the step of forming a plurality of gate cells in an array includes forming cell placement columns and routing columns, the track pitch of the routing tracks in the first metallization layer being approximately 3.2 microns in the cell placement columns and approximately 2.7 microns in the routing columns.

19. A method of manufacturing a gate array cell structure, comprising:

forming a plurality of gate cells in an array;

forming devices within selected gate cells with first metal in a first metallization layer;

interconnecting selected ones of the devices with first metal that is routed along routing tracks extending in a vertical direction over the array, including varying a track pitch of the routing tracks in the first metallization layer; and interconnecting selected ones of the device with second metal in a second metallization layer, the second metal being routed along tracks extending in a horizontal direction over the array, including varying a track pitch of the routing tracks in the second metallization layer, wherein the step of varying the track pitch of the routing tracks in the second metallization layer includes varying the track pitch from approximately 2.8 microns to approximately 3.2 microns.

20. The method of claim 19, wherein the step of forming the gate cells include forming a diffusion area, a polysilicon/polysilicon interface area and a polysilicon/diffusion interface area, the track pitch of the routing tracks in the second layer in the diffusion area being approximately 2.8 microns, and approximately 3.2 microns in the polysilicon/polysilicon interface area and in the polysilicon/diffusion interface area.

* * * * *